(12) United States Patent
Chen et al.

(10) Patent No.: US 6,743,719 B1
(45) Date of Patent: Jun. 1, 2004

(54) METHOD FOR FORMING A CONDUCTIVE COPPER STRUCTURE

(75) Inventors: Linlin Chen, Plano, TX (US); Jiong-Ping Lu, Richardson, TX (US); Changfeng Xia, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/348,821

(22) Filed: Jan. 22, 2003

(51) Int. Cl.[7] .............................................. H01L 21/44
(52) U.S. Cl. ....................... 438/658; 438/674; 438/677; 438/678; 438/687; 438/908
(58) Field of Search ................................ 438/635, 658, 438/660, 674, 677–679, 687, 908, 913

(56) References Cited

U.S. PATENT DOCUMENTS

| 5,316,974 | A | | 5/1994 | Crank |
| 6,221,763 | B1 | | 4/2001 | Gilton et al. |
| 6,245,672 | B1 | * | 6/2001 | Hong et al. ................. 438/648 |
| 6,258,223 | B1 | | 7/2001 | Cheung et al. |
| 6,284,652 | B1 | | 9/2001 | Charneski et al. |
| 6,451,677 | B1 | | 9/2002 | Lu et al. |
| 6,482,740 | B2 | * | 11/2002 | Soininen et al. ............ 438/686 |
| 2002/0058416 | A1 | * | 5/2002 | Kim et al. ................... 438/687 |
| 2002/0100693 | A1 | * | 8/2002 | Lu et al. ...................... 205/157 |

FOREIGN PATENT DOCUMENTS

JP 2002289559 A * 10/2002 ......... H01L/21/288

* cited by examiner

*Primary Examiner*—Lynne Gurley
(74) *Attorney, Agent, or Firm*—Jacqueline J. Garner; W. James Brady III; Frederick J. Telecky, Jr.

(57) ABSTRACT

The present invention provides, in one embodiment, a method of forming a metal layer over a semiconductor wafer. The method includes the chemical reduction of copper oxide (105) over the deposited copper seed layer (110) by exposure to a substantially copper-free reducing agent solution (120), such that the copper oxide (105) is substantially converted to elemental copper, followed by electrochemical deposition of a second copper layer (125) over the copper seed layer (110). Such methods and resulting conductive structures thereof may be advantageously used in methods to make integrated circuits comprising interconnection metal lines.

18 Claims, 3 Drawing Sheets

METHOD FOR FORMING A CONDUCTIVE COPPER STRUCTURE

TECHNICAL FIELD OF THE INVENTION

The present invention is directed, in general, to manufacture of integrated circuits and more specifically to a method for forming an improved conductive interconnect structure.

BACKGROUND OF THE INVENTION

The push to sub-0.18 micron multilevel metallized interconnections, such as lines, via, and trenches, and the desire to produce faster semiconductor devices, has resulted in a shift toward the use of Copper for making electrical interconnections in ultra-large scale integration circuits. The deposition of Copper interconnects are not without difficulties, however. For example, when copper is etched, it tends to be redeposited elsewhere on the semiconductor device, or on the processing chamber. Copper atoms also readily diffuse into silicon-containing dielectric layers. The contamination by Copper in unwanted locations can degrade or destroy the performance of active devices in integrated circuits. One approach to reducing the problems with copper etching and diffusion, is the deposition of an underlying barrier layer to block the migration of Copper atoms into other components of the semiconductor. To facilitate the adhesion of copper to the diffusion barrier, a seed layer of copper is deposited over the diffusion barrier, followed by the deposition of a second thicker copper conducting layer over the copper seed layer.

Typically, the copper seed layer is deposited on a semiconductor wafer by a vacuum process, such as physical vapor deposition (PVD) or chemical vapor deposition (CVD). The thick copper conducting layer is deposited by a wet process, such as electrochemical deposition (ECD) or electrode-less chemical deposition. Because the deposit of the seed layer and thick conducting layer involve two distinct processes and tools, the wafer has to be removed from the copper seed layer depositing tool, exposed to the atmosphere for a period, and then placed in the tool for depositing the thick layer. Backlogs and mismatches in the machine times for seed layer and thick layer deposition can extend the time window where the wafer is exposed to the atmosphere for several hours.

During this time window, the surface of the seed layer oxidizes. In addition, organic contaminants may form on the seed layer. The presence of an oxide layer on the copper seed layer can result in thinning or dissolution of the copper seed layer when placed in acidic electroplating solutions used for ECD. The resulting discontinuities in the seed layer exacerbate the formation of voids in the thick conducting layer during electroplating, thereby negatively impacting device performance and reliability. In addition, the oxide layer may not be fully removed during ECD. The continued presence of an oxide layer between the seed layer and the thick conducting layer weakens adhesion between these layers, making the interconnection more prone to mechanical failure. The current practice is to therefore minimize copper oxidation and organic compound contamination by restricting the period between depositing the seed layer and thick conducting layer by ECD processes. This approach, however may still result in unacceptably high oxidation and increased cycle times and therefore increased costs.

Previous approaches to mitigate copper oxidation and organic compound contamination are flawed, leading to degraded device performance. One approach, for example, is to produce thicker seed layers so that during electroplating, dissolution is not complete, and at least a portion of the copper seed layer remains. The problem with this approach is that for small openings, the thick seed layer can pinch off the trench opening resulting in center voids in the trench feature during the subsequent deposition of the thick conducting layer.

Another approach has been to deposit two seed layers in order to produce a thicker layer with better step coverage inside the trench or via feature. Typically the second seed layer covers the first seed layer and a native oxide layer that forms on the first seed layer. This particular approach, however, has the same problems as described above.

A third approach has been to chemically reduce the copper oxide layer back to elemental Copper in the presence of a Hydrogen gas plasma environment. But because reduction is performed in a separate tool when the wafer is taken out of the reduction tool, oxides formation on the seed layer surface can reoccur during the period when the wafer is waiting for thick Copper layer deposition by ECD. Moreover, there are additional costs and time to perform this reduction step.

A fourth approach has been to electrochemically reduce the copper oxide layer back to elemental copper in the presence of an electrical current. Although, this can be combined with the ECD process, it still requires an additional electrodeposition chamber for performing the electrochemical reduction, thereby resulting in additional processing steps and costs.

Accordingly, what is needed in the art is a method of making copper interconnections that do not exhibit the limitations of the prior art.

SUMMARY OF THE INVENTION

To address the above-discussed deficiencies of the prior art, the present invention provides a method forming a metal layer over a semiconductor wafer. The method includes exposing a copper oxide on a copper seed layer located over a semiconductor substrate, to a substantially copper-free reducing agent solution. The exposure is such that the copper oxide is substantially converted to elemental copper. The method further includes electrochemically depositing a second copper layer over the copper seed layer.

In another embodiment, the present invention provides a method of making an integrated circuit. The method includes forming active devices on a semiconductor substrate and forming interconnect metals lines on a dielectric layer located over the active devices. Forming interconnects on the interconnect metal lines includes exposing a copper oxide on a copper seed layer located over the semiconductor substrate to a substantially copper-free reducing agent solution, as discussed above. Forming interconnects on the interconnect metal lines further includes depositing, by using an electrochemical deposition tool, a second copper layer over the seed layer.

The foregoing has outlined preferred and alternative features of the present invention so that those of ordinary skill in the art better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purpose of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

It has been determined that prior art methods for eliminating or reducing void formation in copper interconnects are problematic because they result in the removal of portions of the desired copper seed layer as well as the undesired copper oxide layer, or they simply cover up the copper oxide layer, or, by virtue of requiring a different tool, they present a time window during which additional oxide formation may occur. The present invention recognizes, for the first time, the advantages of converting the copper oxide layer to elemental copper by exposing the copper seed layer to a substantially copper-free reducing agent solution. Although discussed in the context of forming copper interconnections in, for example, vias, trenches or lines, the present invention could be equally applied to any interconnection where it is desirable to remove an oxide layer from a seed layer prior to depositing a conductive layer over the seed layer.

Figure 1A:
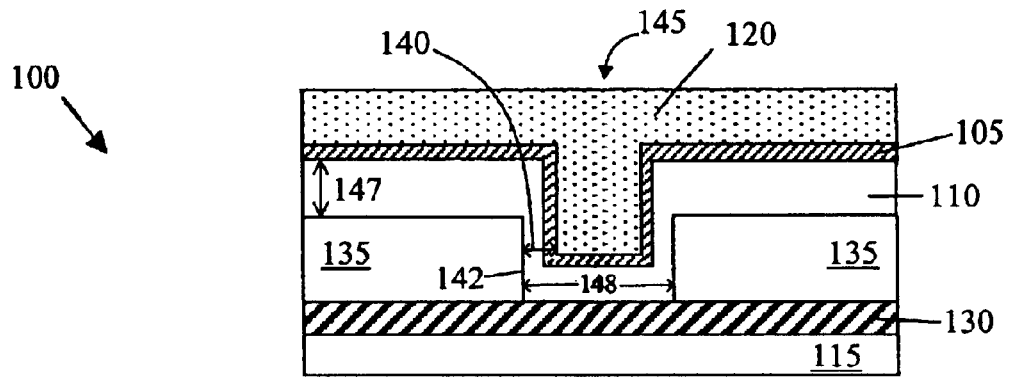
FIGS. 1A to 1C illustrate sectional views of selected steps in a method of forming an exemplary metal layer over a semiconductor wafer according to the principles of the present invention.
Figure 1B:
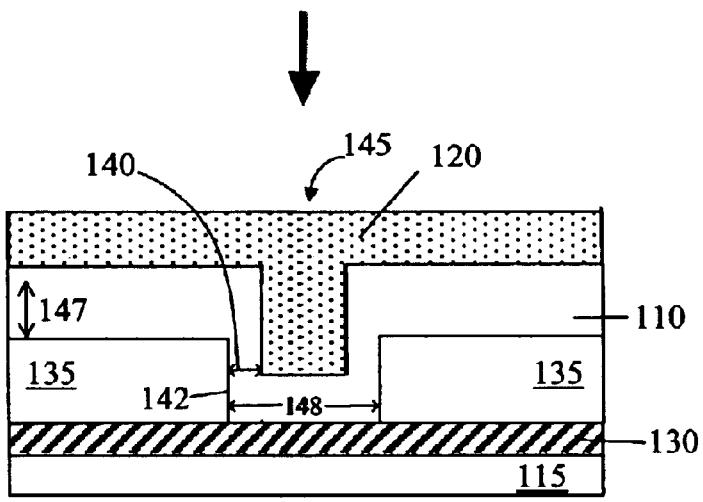
Figure 1C:
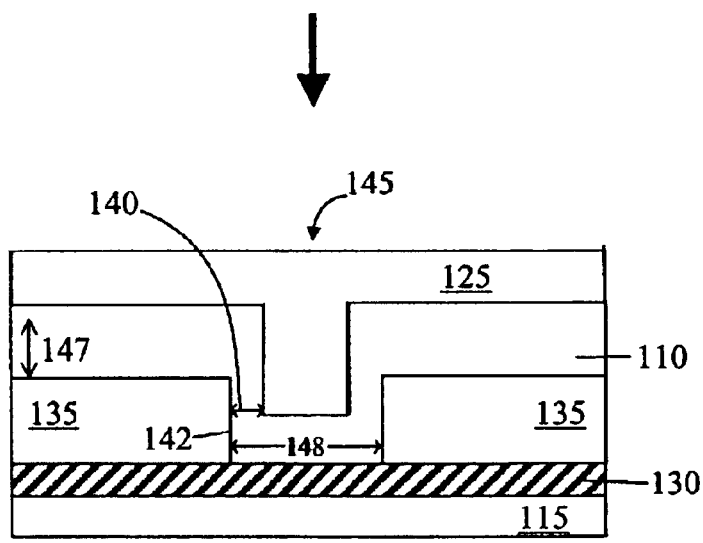

FIGS. 1A to 1C illustrate sectional views of selected steps in a method 100 of forming an exemplary metal layer over a semiconductor substrate according to the principles of the present invention. Turning first to FIG. 1A, illustrated is a step of exposing an oxide 105, such as a copper oxide layer, on a copper seed layer 110 located over a semiconductor substrate 115, to a reducing agent solution 120 substantially free of copper. A substantially copper-free reducing agent is one where the copper concentration is no greater than 2 gm per liter within the solution and, in a preferred embodiment, the concentration of copper is less than about 0.5 gm per liter, and more preferably less than about 0.2 gm per liter. The exposure is such that the copper oxide is substantially converted to elemental copper. The so-converted elemental copper is thus integrated into the copper seed layer 110 (FIG. 1B). The method further includes ECD of a second copper layer 125 over the copper seed layer 110, as illustrated in FIG. 1C.

For the purposes of the present invention, the term substantially converted to elemental copper means at least about 90 percent, and more preferably 99 percent, and even more preferably 99.9 percent, of the copper oxide 105 on the copper seed layer 110 is converted to elemental copper. The term semiconductor substrate 115 as, used herein, refers to any substrate located on or over a semiconductor wafer, including the semiconductor wafer itself. For example, the semiconductor substrate 115 may include a conductive layer 130 and a dielectric layer 135 formed over the semiconductor substrate 115. The dielectric layer 135 may comprise silicon dioxide, and more desirably, a silicon oxide-based low-k dielectric material, such as fluorine or carbon. These and other structures discussed herein may be formed using conventional deposition and photolithographic techniques well known to those skilled in the art.

The exposure of the copper seed layer 110 to substantially the copper-free reducing agent solution 120 need only be for a period sufficient to substantially convert the copper oxide 105 to elemental copper. In certain desirable embodiments, for example, the period of exposure is at least about 1 minute. In certain embodiments, the semiconductor substrate 115 is washed with de-ionized water before being relocated in the next ECD chamber. Preferably, a time window between exposure to the reducing agent solution 120 and electrochemically deposition is less than about 4 hours, and more preferably, less than about 2 hours, and even more preferably less than about 5 minutes, and still more preferably less than about 1 minute.

The copper-free reducing agent solution 120 may comprise any compound or groups of compounds capable of converting the copper oxide 105 to elemental copper within the desired time window and other processing constrains. Preferably the solution 120 includes a reducing agent having a reduction potential that is less than, and more preferably at least about 0.1 Volts lower than, the reduction potential of a copper-containing solution having substantially the same composition and temperature as the solution 120 containing the reducing agent. For example, the reduction potential of a standard 1.0 Molar Copper ion solution at room temperature is about −0.23 Volts. Modification of the temperature, pH, ionic strength and concentration of compounds in the solution 120, or a comparable copper-containing solution, will alter the reduction potential in a predictable manner well known to those skilled in the art. Certain preferred embodiments of the reducing agent include compounds selected from the group consisting of formate, formaldehyde, dimethylamine borane, ammonium hypophosphite, and hydrazine sulfate.

To adjust its concentration, the reducing agent may be dissolved in any liquid compatible with the semiconductor substrate 115 and its overlying structures. More preferably, the reducing agent is dissolved in an aqueous solution. The concentration may be adjusted so as to increase or decrease the rate or extent of conversion of the copper oxide to elemental copper. In certain preferred embodiments, the substantially copper-free reducing agent has a concentration of less than 1 Molar and preferably less than about 0.1 Molar.

An important benefit of the present invention is that a thickness 140 of the copper seed layer after exposure to the reducing agent solution 120 is substantially the same as compared to a deposited copper seed layer, for example within 5 minutes, of the substrate's 115 removal from a copper seed layer depositing tool. Maintaining the copper seed layer at a constant thickness 140 can facilitate the deposition of a second thicker copper layer 125. This, in turn, improves the structural integrity of the metal interconnection, as well as the speed and reliability of transmitting electrical signals through the interconnection.

As well understood by those skilled in the art, the deposition of the copper seed layer 110 results in step coverage, where the thickness of the side walls 142 of an opening 145, such as a via or trench is substantially less, for example about 20 to about 5 percent, compared to the thickness 147 at the top of the substrate 115. In certain preferred embodiments, the thickness 140 of the copper seed layer 110 on the side walls of an opening 145, such as a via or trench opening of about is at least about 20 Angstroms. The preferred side wall thickness 140 of the copper seed layer 110 will depend upon the dimensions of the opening 145. For example, for a via opening length 148 of about 0.18 microns, the side wall thickness 140 is preferably between about 50 and about 100 Angstroms.

Another important benefit of the present invention is that the reduction of the copper oxide to element copper can be achieved without carrying the semiconductor substrate to a different processing tool. Carrying out these steps in the same tool, minimizes the time window where further oxidation of the copper seed layer can occur, and saves clean room floor and reduces fabrication cycle times.

Figure 2A:
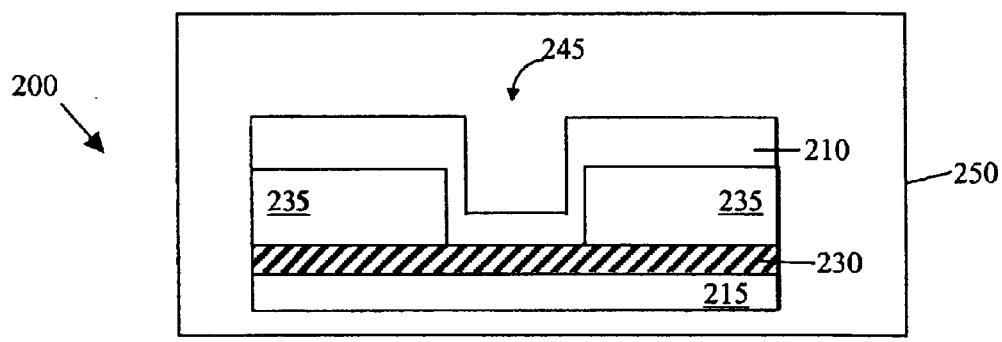
FIGS. 2A to 2B illustrate an exemplary configuration tools to carry out methods steps according to the principles of the present invention.
Figure 2B:
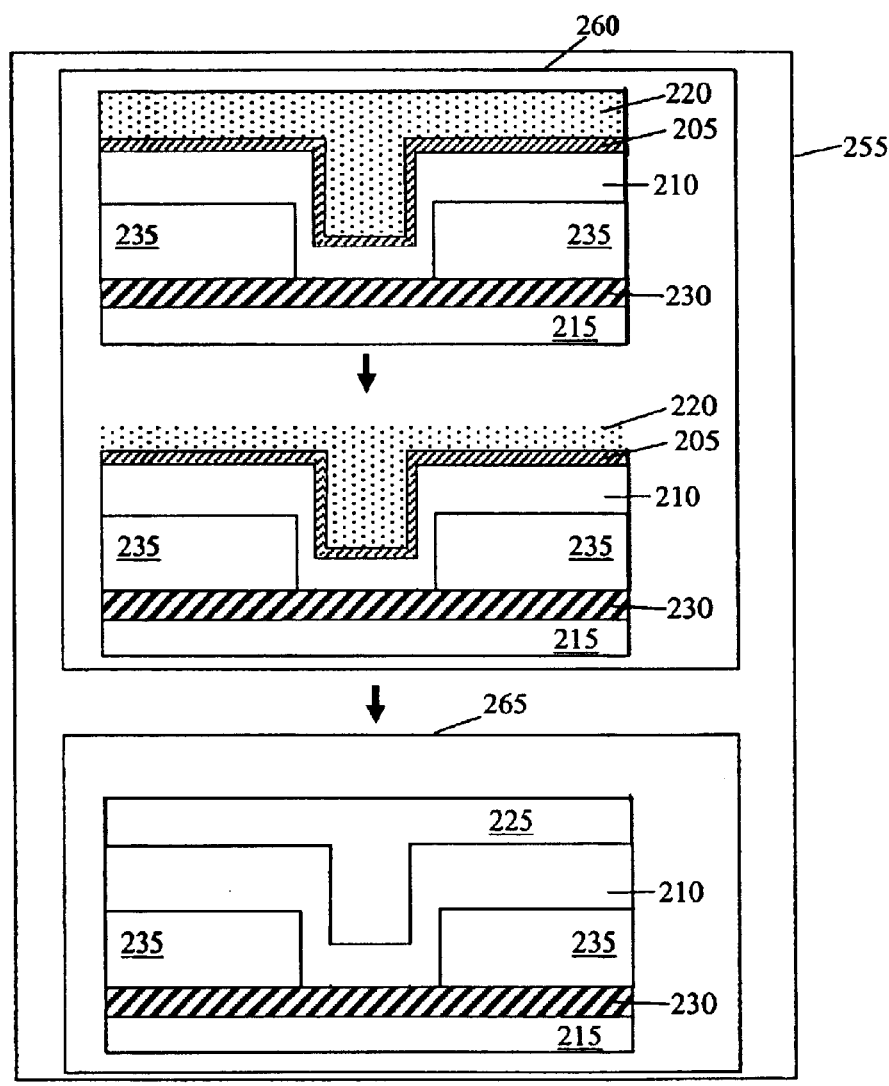

An exemplary configuration of such tools are illustrated in FIGS. 2A and 2B, wherein each tool is schematically represented by the box in which each of the sectional views are located. Using analogous number to illustrate analogous features discussed in FIG. 1, FIG. 2A illustrates that the copper seed layer 210 is preferably formed by conformally depositing copper within an opening 245, such as a via or trench opening, located in the dielectric layer 235 over the semiconductor substrate 215. As seen from this view, the opening 245 exposes an area of the conductive layer 230 that is located under the dielectric layer 235. This deposition is preferably achieved by using a seed layer deposition tool 250. The tool 250 may include instruments for chemical vapor deposition (CVD), and more preferably physical vapor deposition (PVD).

Electrochemically deposition of the second copper layer is performed using a separate multi-chambered conventional ECD tool 255, as illustrated in FIG. 2B, wherein each chamber of the ECD tool 255 is schematically represented by the inset boxes in which the sectional views are located. During transfer of the semiconductor substrate 215 from the deposition tool 250 to the ECD tool 255, the copper oxide 205 forms as a result of the oxidation of the copper seed layer 210. Preferably, the ECD tool 255 includes a drying chamber 260 and an electrochemical depositing or plating chamber 265. It is advantageous to expose the copper seed layer 210 to the substantially copper-free reducing agent solution 220 in the same chamber 260 as used for drying the semiconductor substrate 215. For example, the copper-free reducing agent solution 220 may be placed on the seed layer while the semiconductor substrate 215 is in a spin rinse drying (SRD) chamber 260 that is part of the same tool 255 used for electrochemical deposition.

In certain preferred embodiments, the exposure to the copper-free reducing agent solution 220 continues until immediately before drying and then moving the semiconductor substrate 215 into the electrochemical depositing chamber 265. It is preferred that the exposure of the copper oxide 205 to the copper-free reducing agent solution 220 and the electrochemical deposition of the second copper layer 225 be carried out in the same tool to minimize any further oxidation of the copper seed layer 210. In such embodiments, the copper seed layer's 210 exposure to an oxidizing atmosphere is preferably for less than about 1 minute.

Figure 3A:
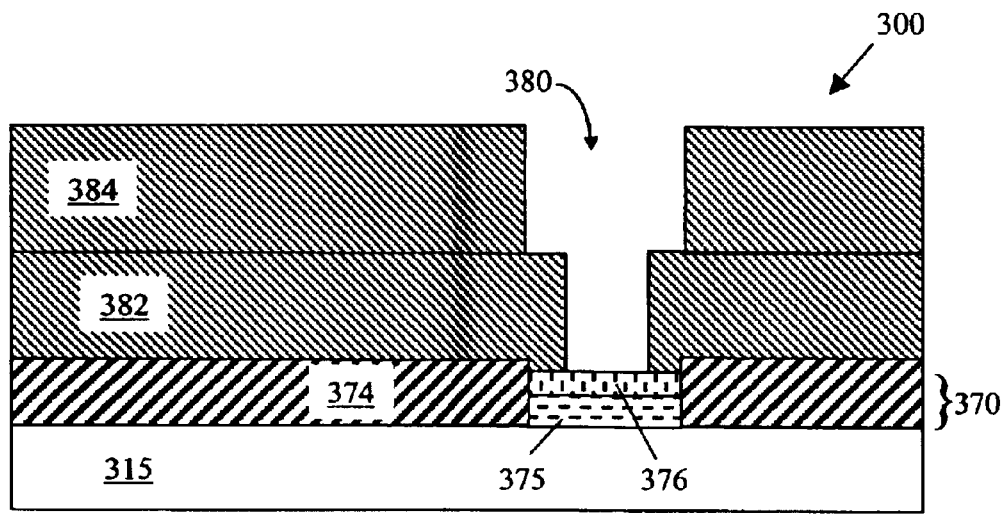
FIGS. 3A to 3C illustrate sectional views of selected steps in a method of making an exemplary integrated circuit according to the principles of the present invention.
Figure 3B:
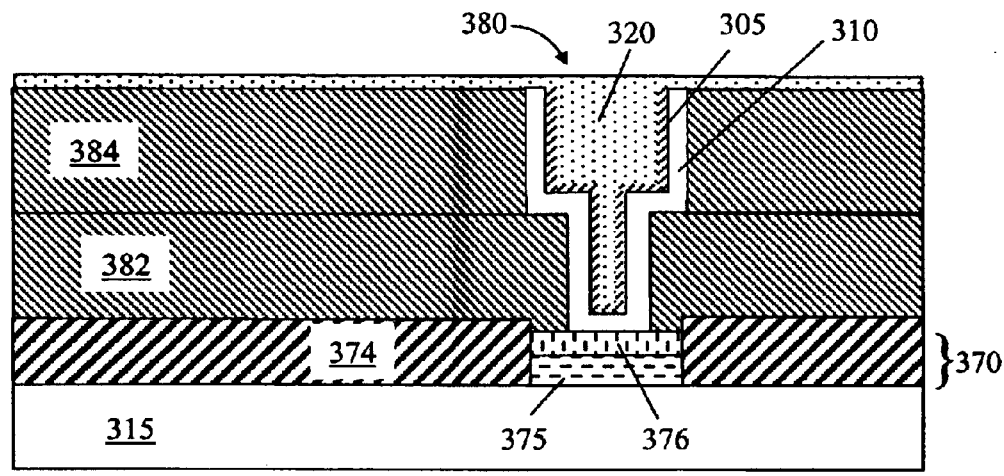
Figure 3C:
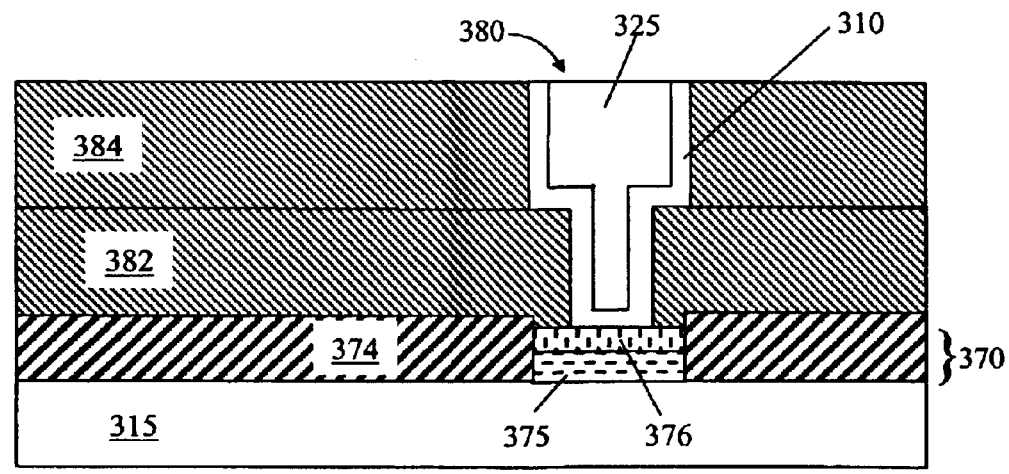

FIGS. 3A–C illustrate another aspect of the present invention, a method 300 of making an integrated circuit at different stages of fabrication. FIG. 3A illustrates forming active devices 370 on a semiconductor substrate 315. The active device 370 may include conventional MOS integrated circuit components, such as a doped region 375 or source/drain regions found in conventional CMOS devices, located between field oxide structures 374 and below a gate structure 376. Such structures and their method of fabrication, are more fully discussed, for example, in U.S. Pat. No. 6,245,672 to Hong et al., which is incorporated by reference herein. FIG. 3A also shows forming interconnect metals lines 380 in or on one or more dielectric layers 382, 384 located over the active devices 370.

Forming the interconnect 380 includes exposing a copper oxide 305 on a copper seed layer 310 located over the semiconductor substrate 315 to a substantially copper-free reducing agent 320, in accordance with the processes discussed above (FIG. 3B). Forming the interconnect 380 also includes electrochemically depositing a second copper layer 325 using an electrochemical deposition tool and the processes discussed above (FIG. 3C). Any of the above described embodiments, including the copper seed layer and substantially copper-free reducing agent solution, may be applied to the method of making the integrated circuit 300. One of ordinary skill would understand that the method may further be extended to form any number of additional interconnects located over the interconnect metal line 380 and would understand how to connect those interconnects with the active devices to form an operative integrated circuit.

Although the present invention has been described in detail, one of ordinary skill in the art should understand that they can make various changes, substitutions and alterations herein without departing from the scope of the invention.

What is claimed is:

1. A method of forming a metal layer over a semiconductor wafer, comprising:

exposing a copper oxide on a copper seed layer located over a semiconductor substrate to a substantially copper-free reducing agent solution, such that said copper oxide is substantially converted to elemental copper, wherein said substantially copper-free reducing agent solution comprises a reducing agent selected from the group consisting of formate, formaldehyde, dimethylamine borane, ammonium hypophosphite, and hydrazine sulfate; and electrochemically depositing a second copper layer over said copper seed layer.

2. The method as recited in claim 1 wherein said exposing and said electrochemically depositing is conducted in a same deposition tool.

3. The method as recited in claim 1, further includes drying said copper seed layer after said exposing said copper seed layer to a substantially copper-free reducing agent solution wherein said drying and said exposing are performed in the same tool.

4. The method as recited in claim 1, further includes a time window between said exposing and said electrochemically depositing, of less than about 4 hours.

5. The method as recited in claim 1, wherein said reducing agent has a reduction potential that is less than a reduction potential of a copper-containing solution having essentially the same composition as the copper-free reducing agent solution.

6. The method as recited in claim 1, wherein said substantially copper-free reducing agent is dissolved in an aqueous solution.

7. The method as recited in claim 1, wherein said substantially copper-free reducing agent has a concentration less than about 1 molar.

8. The method as recited in claim 1, wherein a thickness of said copper seed layer after said exposing to said substantially the same as compared to a deposited copper seed layer.

9. The method as recited in claim 1, wherein said thickness of said copper seed layer after said exposing to said substantially copper-free reducing agent is at least about 20 Angstroms.

10. A method of making an integrated circuit comprising:
   forming active devices over or in a semiconductor substrate;
   forming interconnect metals lines on a dielectric layer located over said active devices including:
      exposing a copper oxide on a copper seed layer located over said semiconductor substrate to a substantially copper-free reducing agent solution, such that said copper oxide is substantially converted to elemental copper, wherein said substantially copper-free reducing agent solution comprises a reducing agent selected from the group consisting of formate, formaldehyde, dimethylamine borane, ammonium hypophosphite, and hydrazine sulfate;
      depositing, using an electrochemical deposition tool, a second copper layer over said seed layer;
   connecting said interconnects with said active devices to form an operative integrated circuit.

11. The method as recited in claim 10 wherein said exposing is conducted in said electrochemical deposition tool.

12. The method as recited in claim 10, further includes drying said copper seed layer after said exposing said copper seed layer to a substantially copper-free reducing agent solution wherein said drying and said exposing are performed in the same tool.

13. The method as recited in claim 10, further includes a time window between said exposing and said electrochemically depositing, of less than about 4 hours.

14. The method as recited in claim 10, wherein said reducing agent has a reduction potential of a copper-containing solution having essentially the same composition as the copper-free reducing agent solution.

15. The method as recited in claim 10, wherein said substantially copper-free reducing agent is dissolved in an aqueous solution.

16. The method as recited in claim 10, wherein said substantially copper-free reducing agent has a concentration of less than about 1 molar.

17. The method as recited in claim 10, wherein a thickness of said copper seed layer after said exposing is substantially the same as compared to a deposited copper seed layer.

18. The method as recited in claim 10, wherein said thickness of said copper seed layer after said exposing to said substantially copper-free reducing agent is at least about 20 Angstroms.

* * * * *